United States Patent [19]

McKee et al.

[11] Patent Number: 5,906,857
[45] Date of Patent: May 25, 1999

[54] APPARATUS, SYSTEM AND METHOD FOR CONTROLLING EMISSION PARAMETERS ATTENDING VAPORIZED IN A HV ENVIRONMENT

[75] Inventors: Rodney Allen McKee, Kingston; Frederick Joseph Walker, Oak Ridge, both of Tenn.

[73] Assignee: Ultratherm, Inc., Kingston, Tenn.

[21] Appl. No.: 08/855,191

[22] Filed: May 13, 1997

[51] Int. Cl.$^6$ .................................................. C23C 14/00
[52] U.S. Cl. .......................... 427/8; 427/248.1; 118/688; 118/708; 118/712; 118/720; 118/726
[58] Field of Search .................................. 118/720, 726, 118/688, 708, 712; 427/8, 248.1

[56] References Cited

U.S. PATENT DOCUMENTS

| | | | |
|---|---|---|---|
| 3,636,916 | 1/1972 | Thelen | 118/720 |
| 4,328,763 | 5/1982 | Sommerkamp et al. | |
| 4,543,467 | 9/1985 | Eisele et al. | |
| 4,579,083 | 4/1986 | Boivin | |
| 5,126,165 | 6/1992 | Akihama | 118/728 |
| 5,288,328 | 2/1994 | Nouvelot | 118/726 |

OTHER PUBLICATIONS

Advertisement literature relating to effusions cells from Pascal Technologies, Eden Prairie, Minnesota: 4 pieces, no date.

Primary Examiner—Richard Bueker

[57] ABSTRACT

An apparatus, system and method for controlling parameters attending the emission of a vaporized material from a source in a HV environment utilizes at least one shutter which is rotatably mounted over an exit opening through which vaporized material must exit the source. The shutter has a closure portion and is mounted adjacent the exit opening associated with the source for rotation about an axis so that by rotating the shutter about the rotation axis, the closure portion repeatedly covers and uncovers the exit opening in an intermittent fashion to prevent the emission of a vaporized material from the source during the periods of shutter rotation during which the exit opening is covered by the closure portion and to permit the emission of a vaporized material from the source during the periods of shutter rotation during which the exit opening is uncovered by the closure portion. By using a pair of superposed shutters whose closure portions can be positionally altered with respect to one another, the intervals during which the exit opening is uncovered by the closure portions throughout each revolution of the shutters can be adjusted. In addition, the accuracy of control of the emission parameters can be enhanced by monitoring the emission of the vaporized material from the source and altering appropriate conditions, such as the speed of rotation of the shutter about its rotation axis, in response to the monitored characteristics. Further still, this invention fundamentally shifts the functional capability of MBE methodology away from its traditional 1 monolayer/second limitation.

17 Claims, 5 Drawing Sheets

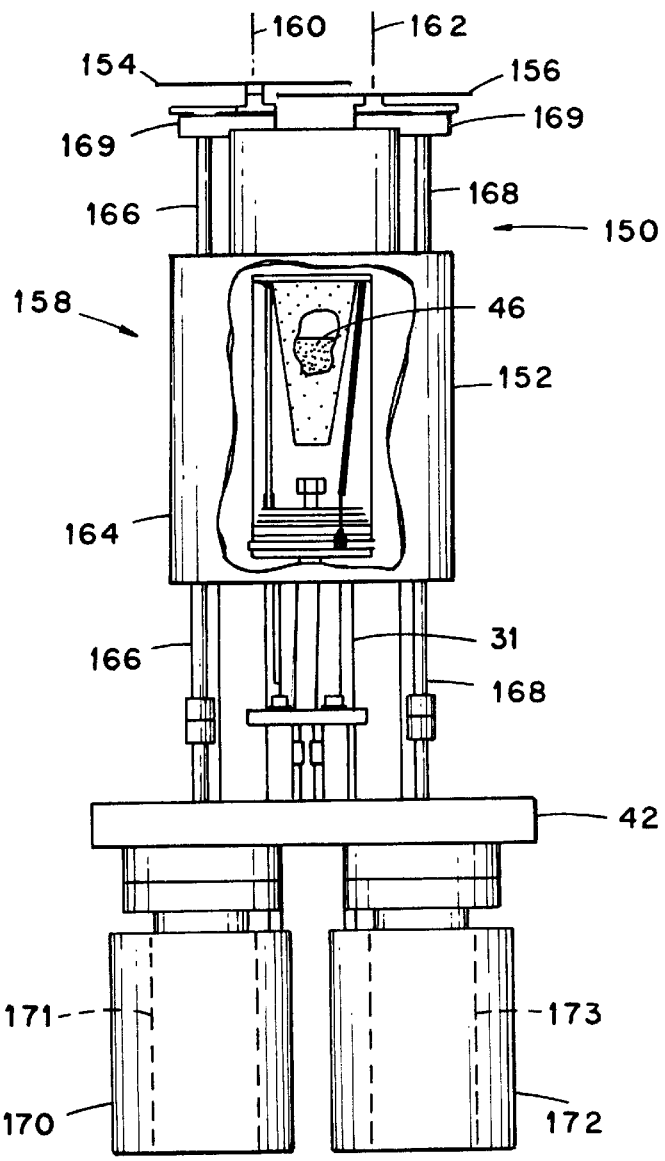
*Fig.12*
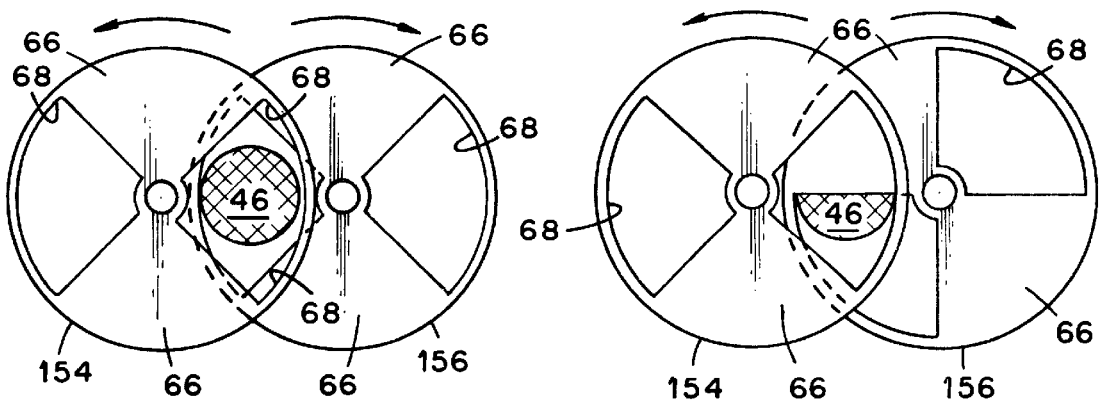
*Fig.13*   *Fig.14*

APPARATUS, SYSTEM AND METHOD FOR CONTROLLING EMISSION PARAMETERS ATTENDING VAPORIZED IN A HV ENVIRONMENT

BACKGROUND OF THE INVENTION

This invention relates generally to the emission of vaporized material from a source in a high vacuum (HV) environment and relates, more particularly, to the means and methods for controlling the flux and other emission parameters attending the vaporized material.

Material which has been vaporized from a source is used in many growth/deposition applications wherein atoms and/or molecules of the vapor are deposited upon a substrate in a HV environment. Such applications include molecular beam epitaxy (MBE), electron-beam epitaxy, sputtering, laser ablation, thermal evaporation and metal organic chemical vapor deposition (MOCVD). In each application, the material is emitted from a source in a vapor and directed toward the surface of a substrate for deposition thereon. In an MBE process, for example, material to be vaporized is contained within an effusion cell and vaporized from the cell by appropriate heating means.

One parameter, or characteristic, attending the emission of vaporized material from the source is the flux of the material. The flux of the vaporized material is the rate of discharge of the vaporized material from the source (measured, for example, in atoms per second per centimeter squared) and has heretofore been controlled in deposition applications by controlling the temperature of the source. Generally, therefore, in order to increase the flux of vaporized material from the source, the source material is heated to a higher temperature, and in order to decrease the flux, the temperature of the source is lowered. Such an approach possesses disadvantages, however, which can relate to irreproducible fluxes, long equilibration times, and delays in growth necessary to measure and adjust the flux. Thus, prior art methods for controlling flux solely by temperature-control schemes are time-consuming in nature.

On the other hand, the control of the flow or emission of the vaporized material from the source, rather than the flux, commonly involves the use of a mechanical shutter which is mounted for pivotal movement adjacent the mouth of the source. During a deposition process involving such a shutter, the shutter is pivotally moved back and forth across the mouth of the source between two positions (i.e. opened and closed positions) to control the exposure of the substrate to the source and consequently control the flow of atoms and/or molecules from the source toward the substrate.

If such mechanical shutters are operated rapidly (to provide, for example, an open period of no more than 1.6 seconds), the uniformity (i.e. flatness) of the flux profile emitted from the source suffers, and the uniformity of the resulting deposition suffers accordingly. Therefore, to ensure that the flux profile is relatively uniform, the periods of time that these shutters are open are typically no less than 1.6 seconds in duration. Consequently, a deposition process performed with such shutters is a time-consuming process, and when considering the fact that temperature-control schemes are time-consuming in nature, as mentioned above, some prior art vapor deposition processes performed in a HV environment have not heretofore been considered to be practical for mass production processes. In other words, the time-related constraints which attend prior art vapor deposition processes of this class (such as MBE) have so far outweighed the benefits gained by such prior art deposition processes that these processes have not heretofore been employed in silicon-based semiconductor fabrication facilities.

It is an object of the present invention to provide a new and improved shutter apparatus and system for controlling parameters attending the emission of vaporized material from a source in a growth/deposition application involving a HV environment and an associated method.

Another object of the present invention is to provide such an apparatus and system capable of controlling the flux and related parameters of the vaporized material with a high degree of accuracy and which circumvents many of the time-related constraints attending vapor deposition processes of the prior art.

Still another object of the present invention is to provide such an apparatus and system enabling the growth of stoichiometric line compounds with greater accuracy and control over the growth process, and which promotes uniformity of growth of the deposited materials upon a substrate and a more rapid deposition of vaporized material than was capable of being achieved with conventional deposition processes.

Yet another object of the present invention is to provide such an apparatus and system wherein the parameters attending the vaporized material can be adjusted so rapidly while preserving the uniformity of the flux profile that vapor deposition processes of the prior art which have heretofore not been considered as practical for mass production processes are now practical.

A further object of the present invention is to provide such an apparatus and system which is uncomplicated in construction yet effective in operation.

SUMMARY OF THE INVENTION

This invention resides in an apparatus, system and method for controlling at least one parameter attending the emission of a vaporized material from a source in a HV environment wherein there is associated with the source an exit opening through which vaporized material must exit the source.

Each of the apparatus and system of the invention includes a shutter including a body having a closure portion and means for mounting the body of the shutter adjacent the exit opening associated with the source for rotation about an axis so that by rotating the shutter about the rotation axis, the closure portion repeatedly covers and uncovers the exit opening in an intermittent fashion. Also includes within the apparatus and system is means for rotating the shutter in one rotational direction about the rotation axis to prevent the emission of a vaporized material from the source during the periods of shutter rotation during which the exit opening is covered by the closure portion and to permit the emission of a vaporized material from the source during the periods of shutter rotation during which the exit opening is uncovered by the closure portion.

The method of the invention includes the steps involved in utilizing the apparatus of the invention for controlling an emission parameter. More specifically, the apparatus shutter is provided and then mounted adjacent the exit opening associated with the source for rotation about an axis so that by rotating the shutter about the rotation axis, the closure portion thereof repeatedly covers and uncovers the exit opening in an intermittent fashion. The shutter is subsequently rotated in one rotational direction about the rotation axis to prevent the emission of a vaporized material from the source during the periods of shutter rotation during which the exit opening is covered by the closure portion and to permit the emission of a vaporized material from the source during the periods of shutter rotation during which the exit opening is uncovered by the closure portion.

In one embodiment of the method, there is spaced from the source an exit opening through which vaporized material moves from the source, and the method includes the steps of monitoring the evaporation rate of the vaporized material moving from the source at a location disposed generally between the source and the exit opening and utilizing the monitored evaporation rate to alter at least one parameter attending the emission of the vaporized material from the source.

BRIEF DESCRIPTION OF THE DRAWINGS

FIG. 12 is a view similar to that of FIG. 2 illustrating an alternative embodiment of a control system for use with an effusion cell assembly.

FIG. 13 is a plan view of the superposed shutters of the FIG. 11 control system wherein the through-openings of the shutters are in phase with one another.

FIG. 14 is a plan view of the superposed shutters of the FIG. 11 control system wherein the through-openings of the shutters are forty-five degrees out of phase with one another.

DETAILED DESCRIPTION OF THE ILLUSTRATED EMBODIMENTS

Figure 1:
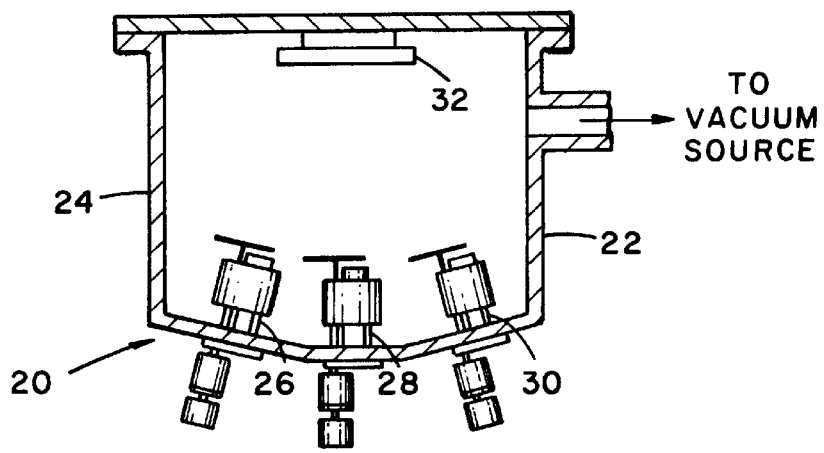
FIG. 1 is a schematic cross-sectional view of a high vacuum (HV) growth/characterization facility within which an embodiment of a control system is utilized.

With reference to FIG. 1, there is shown an exemplary environment within which a source flux control system, generally indicated 20, is utilized. In particular, the FIG. 1 environment includes a high vacuum (HV) growth/characterization facility 22 used to deposit a layup of vaporized materials upon a substrate 32. To this end, the facility 22 includes a container 24 having an inner chamber within which the substrate 32 is positioned so as to face downwardly and which is capable of being evacuated to extremely low vacuum conditions by means of a suitable vacuum source. The materials desired to be deposited upon the substrate 32 are contained within a plurality of effusion cell assemblies mounted to the underside of the facility 22. In the depicted example, there are three effusion cell assemblies 26, 28 and 30 mounted upon the facility 22 for the purpose of containing sources of three different elements, but a larger or smaller number of cell assemblies can be employed.

Figure 10:
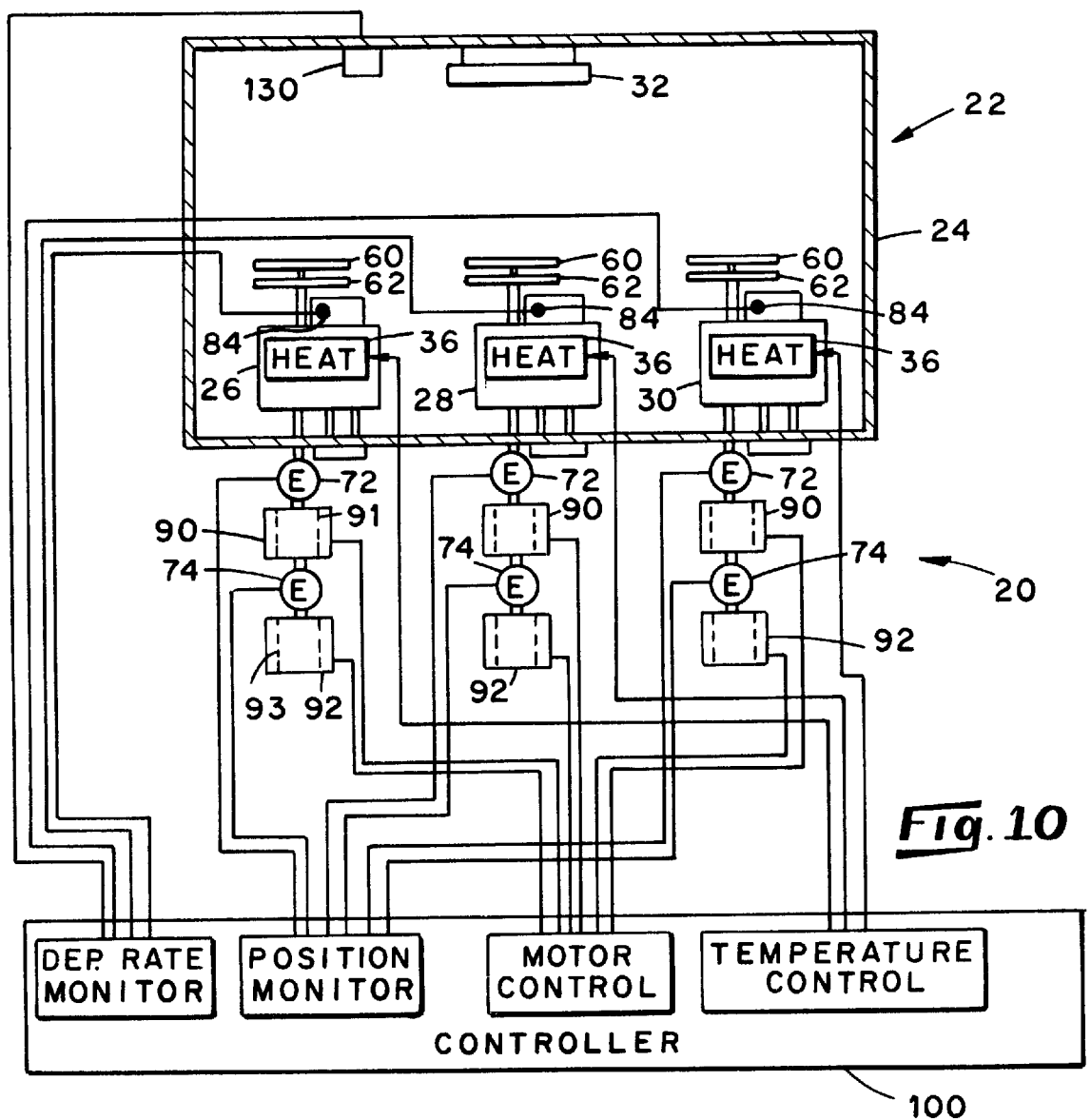
FIG. 10 is a view illustrating in block diagram form the operation of the FIG. 1 facility.

During a growth/deposition process performed within the facility 22, the container 24 is evacuated to a high vacuum condition (e.g. an ultra-high vacuum condition) and the materials contained within the effusion cell assemblies 26, 28 and 30 are vaporized by a heating process. The control system 20 is associated with the cell assemblies 26, 28 and 30 for controlling at least one parameter (e.g. flux) attending the emission of the vaporized materials from the source so that the deposition of the vaporized materials upon the substrate 32 is controlled. As will be apparent herein, the control system 20 is well-suited for applications in which a high degree of accuracy and uniformity of depth and deposition rate is desired in the resultant build-up of the deposited material. Moreover, a deposition process performed with the facility 22 and the control system 20 is computer-controlled with feedback monitoring loops, described herein. To this end, there is associated with the facility 22 a computer controller 100 (FIG. 10) whose function is also described herein.

Although the control system 20 addressed herein is described as being used in conjunction with an molecular beam epitaxy (MBE) process wherein a source material is vaporized by a heating process for deposit upon a substrate, the principles of the system 20 can be applied to other growth/deposition applications that make use of effusion sources and in which it is desired to control the flux and/or other parameters related to the emission of material released from a source in a vapor. Alternative applications include, for example, electron-beam deposition, sputtering, laser ablation, thermal evaporation and metal organic chemical vapor deposition (MOCVD). Accordingly, the principles of the present invention can be variously applied.

Figure 2:
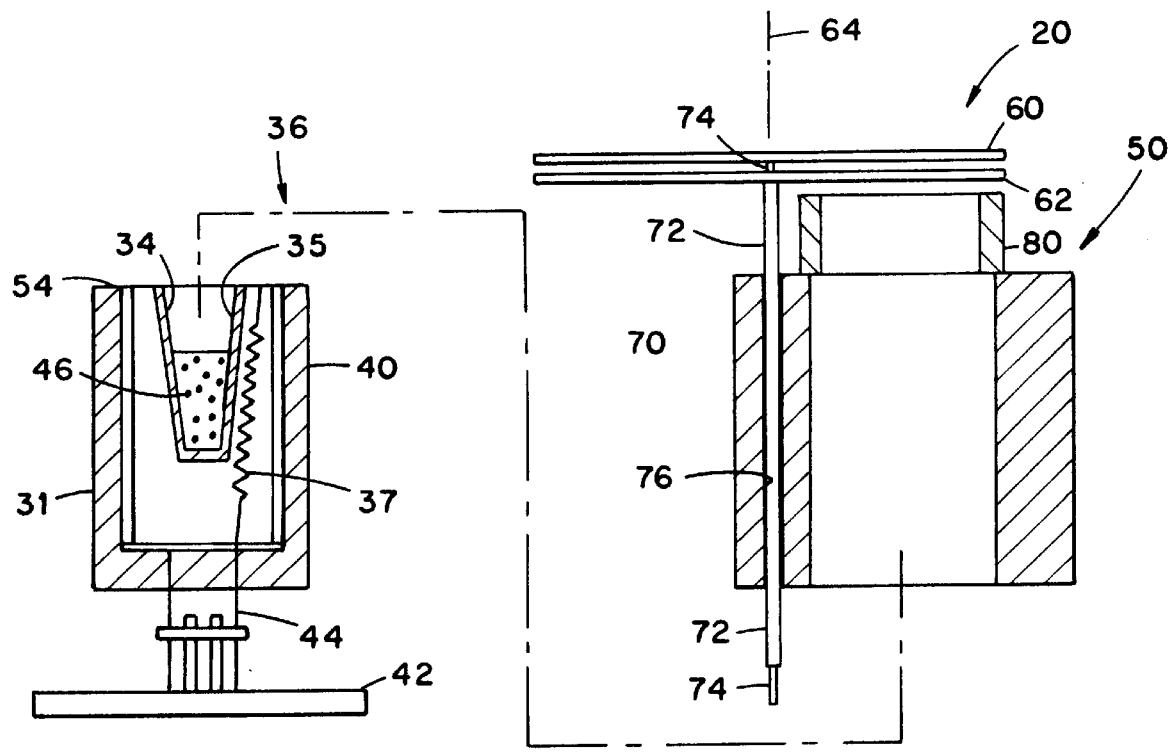
FIG. 2 is a longitudinal cross-sectional view of a fragment of an effusion cell assembly utilized in the FIG. 1 facility, shown exploded.

As illustrated by the effusion cell assembly 36 shown in FIG. 2, each effusion cell assembly 26, 28 or 30 associated with the FIG. 1 facility 22 includes an effusion cell 31 having a body within which a material-holding crucible 34 is supported and electrical heating elements 37 positioned in heat transfer relationship with the outer surface of the crucible 34. The crucible 34 has a substantially planar mouth 35 adjacent the upper end of the cell 31 which serves as a port through which vaporized material must pass as it is released from the remainder of the source material, indicated 46 in FIG. 2, contained within the crucible 34. As will be described in greater detail herein, the source flux control system 20 is adapted to repeatedly cover and uncover the crucible 34 in a manner which accurately and precisely controls the emission of the vaporized materials from the cell.

Effusion cells, such as the cell 31 of FIG. 2, are well known so that a detailed description of the construction of such a cell is not believed to be necessary. Suffice it to say that the FIG. 2 cell 31 includes an elongated body portion 40 within which the material-containing crucible 34 is supported and an attachment flange portion 42 joined to the body portion 40 enabling the cell 31 to be attached to the outer surface of the facility container 24. To attach the cell 31 upon the container 24, the body portion 40 is inserted through an appropriate opening provided along the bottom of the container 24 so that the crucible 34 is disposed within the inner chamber of the facility 22, and then the attachment flange portion 42 is appropriately sealed and secured, as with bolts, to the outer surface of the container 24. Conductors 44 extend between the heating elements 36 and the attachment portion 42 enabling transmission of electrical current to the elements 36 from a power source located external of the container 24. It follows that the temperature of the crucible 34, and consequently the temperature of the source material 46 contained therein, can be raised to, lowered to or maintained at a desired temperature by controllably energizing the heating elements 36. An effusion cell of the aforedescribed class (and which is capable of raising the temperature of the material within the crucible 34 to at least 2,000° C.) is currently available from UltraTherm, Inc. of Kingston, Tenn. under the trade designation PyroCell.

With reference still to FIG. 2, the control system 20 includes at least one shutter, described herein, adapted to rotate across the mouth 35 of the crucible 34 in a manner which repeatedly opens and closes off the exposure of the source material 46 within the crucible 34 to the substrate 32 in an intermittent fashion and means, generally indicated 50, for supporting the shutter for movement across the crucible 34. In the depicted embodiment, the system 20 includes a pair of shutters 60, 62 (comprised, for example, of molybdenum or other refractory materials) arranged in superposed relationship and mounted adjacent the effusion cell 31 for rotation about an axis 64 disposed substantially normal to the plane of the crucible mouth 35. With reference to FIGS. 2–6, each shutter 60 or 62 is platen in shape, circular in form and is disposed across the upper (exit) end, indicated 54 in FIGS. 2 and 3, of the cell 31 so as to be oriented substantially parallel to the opening, or mouth 35, of the crucible 34. As best shown in FIG. 4, each shutter 60 or 62 includes a pair of closure sector sections 66 between which are defined a pair of sector-shaped through-openings 68. In addition, the side edges of the through-openings 68 of the depicted shutters 60 and 62 are straight and extend radially across the body of the shutters from the axis 64, but alternative configurations of the edges of the shutter through-openings can be had.

For purposes of mounting the shutters 60, 62 across the exit end 54 of the cell 31 and with reference again to FIG. 2, the mounting means 50 includes a cylindrical metal jacket 70 (within which cooling water can be circulated) secured about the elongated body portion 40 of the cell 31 and a pair of concentrically-arranged shafts 72, 74 which extend through an axially-extending bore 76 provided in the body of the jacket 70. More specifically, one shaft 72 is hollow and is appropriately journaled (i.e. with suitable bearings) within the bore 76 of the jacket 70, and the shutter 62 is attached to the upper end of the hollow shaft 72. By comparison, the other shaft 74 extends through the core of the hollow shaft 72 for rotation with respect thereto, and the shutter 60 is attached to the upper end of the (inner) shaft 74. The lower ends of the shafts 72 and 74 are coupled to the exterior of the facility container 24 by way of an appropriate rotary vacuum feedthrough 91 or 93 mounted to the attachment flange portion 42 of the cell 31 for the transmission of rotary motion to the shafts 72 and 74 in a manner apparent herein.

With reference again to FIGS. 2 and 3, there is associated with the mounting means 70 a collar 80 which is secured atop the jacket 70 so as to encircle the mouth 35 of the crucible 34. This collar 80 serves as a spacer between the crucible mouth 35 and the underside of the shutters 60 and 62 and includes an opening 82 in one side thereof through which a deposition rate monitor 84 (FIG. 3) is positioned. During use of the system 20 during a deposition process, the deposition rate monitor 84 monitors (as a function of the pressure sensed within the interior of the collar 70) the rate of the atoms being emitted (or vaporized) from the source 46. As will be apparent herein, by disposing the deposition rate gauge monitor 84 between the source 46 and the underside of the shutters 60, 62 for collecting information thereat, the information gathered by the monitor 84 is used in a feedback loop to enhance the accuracy of control of the deposition process. Since the shutters 60, 62 will be heated by the vaporized material which strike the underside thereof, cooling means (not shown) can be incorporated within the system for cooling the shutters 60, 62.

Figure 3:
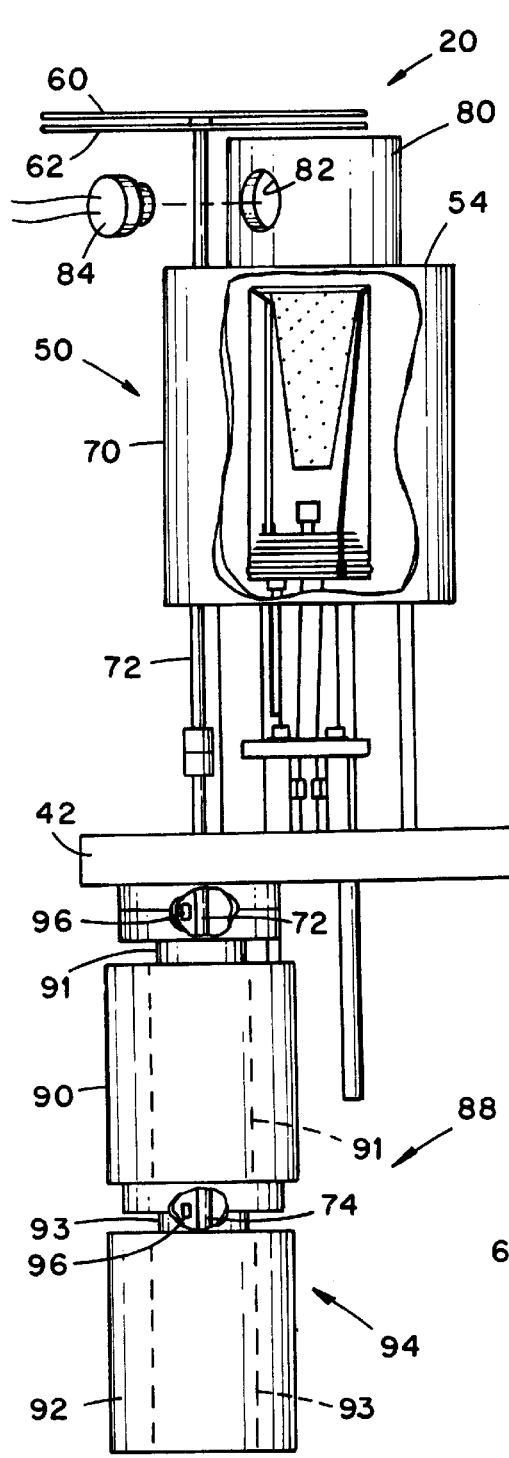
FIG. 3 is a longitudinal view, shown partially cut-away, of the FIG. 2 cell assembly, shown assembled.
Figure 4:
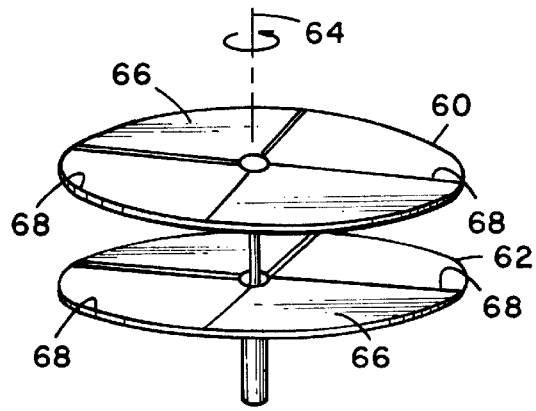
FIG. 4 is a perspective view of the superposed, coaxial shutters of the FIG. 3 control system.
Figure 5:
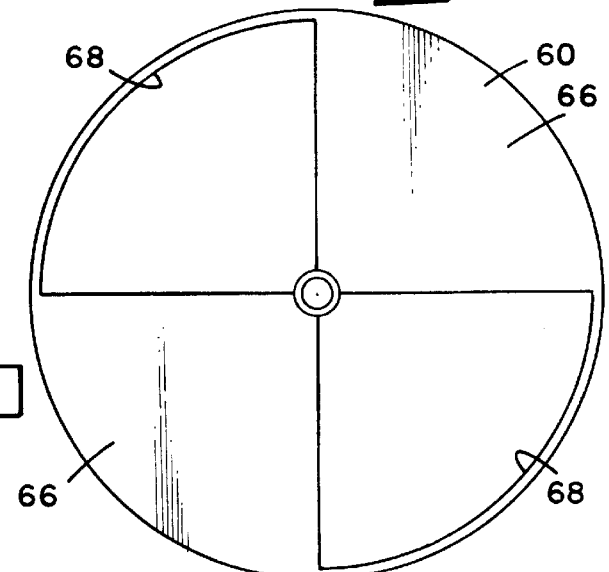
FIG. 5 is a plan view of the superposed shutters of the FIG. 3 control system wherein the through-openings of the shutters are in phase with one another.
Figure 6:
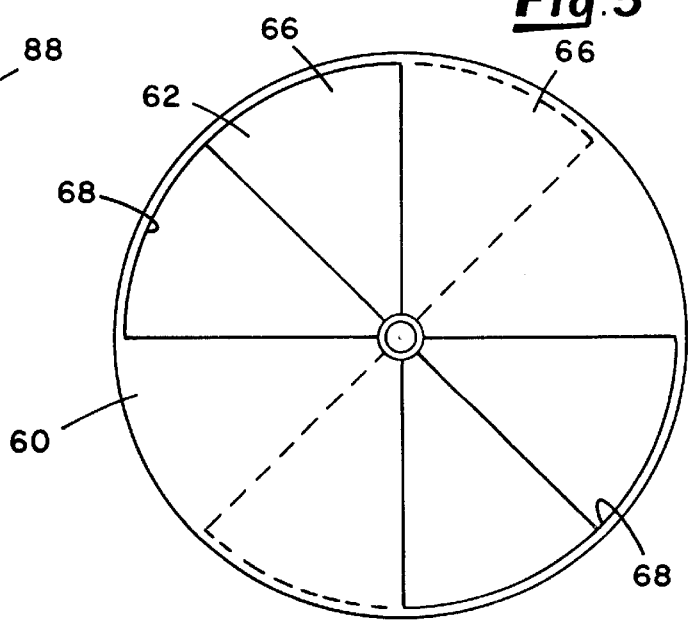
FIG. 6 is a plan view of the superposed shutters of the FIG. 3 control system wherein the through-openings of the shutters are forty-five degrees out of phase with one another.

The control system 20 also includes means, generally indicated 88 in FIG. 3, for rotating the shutters 60, 62 across the exit end 54 of the cell 31 and, more specifically, the mouth 35 of the crucible 34. To this end, the rotating means 88 includes a pair of variable-speed servomotors 90 and 92 arranged in a stacked relationship beneath the attachment portion 42 of the cell 31 and which are each suitably coupled to a corresponding one of the shafts 72 or 74 by the aforementioned rotary vacuum feedthroughs 91 and 93. Thus, by controlling the speed and actuation of the motors 90 and 92, the movement of the shutters 60 and 62 across the exit end 54 of the cell 31 can be controlled.

With reference still to FIG. 3, the control system 20 also includes encoder means, generally indicated 94, associated with the shafts 72 and 74 and connected to the controller 100 (FIG. 10) for determining the position of the shutters 60 and 62 relative to one another about the rotation axis 64. In the depicted embodiment, the encoder means 94 includes a detent affixed to each shaft (adjacent the lower end thereof) and a sensor 96 mounted alongside the shaft for generating a signal each time the detent moves past the sensor 96. Each sensor 96 is, in turn, appropriately coupled to the controller 100 for determining, as a function of rotational speed of the shafts 72 and 74 and the period of time between signals from the sensors 96, the position of the shutters 60 and 62 relative to one another about the axis 64.

It follows from the foregoing that the shutters 60 and 62 are adapted to be rotated independently of one another about the axis 64. As a practical matter, it is envisioned that the shutters 60 and 62 be rotated in unison (i.e. at the same rotational speed) and in the same rotational direction about the axis 64 while the independence of the shutters 60 and 62 be utilized to alter the position of one shutter 60 or 62 relative to the other shutter 62 or 60 about the axis 64. For example and with reference again to FIG. 5, there is shown the relative disposition of the through-openings 68 of the shutters 60 and 62 when positioned in phase with one another. In the interests of the present invention, the shutters are "in phase" when the through-openings thereof are totally aligned so as to provide the largest open area through the superposed shutters. Therefore, when rotating the depicted shutters 60, 62 (whose open areas are equal in size to the sum of two ninety-degree sectors of the shutters) in unison, at constant velocity and in phase with one another, the substrate 32 is exposed to the vapors from the source 46 throughout one-half of the period of each revolution of the shutters 60 and 62 about the axis 64. The vapor which is blocked by the closure sections of the shutters condenses on the underside thereof and is thereby prevented from passing through the shutters.

By comparison, the shutters 60 and 62 are "out of phase" with one another when the through-openings 68 thereof are not totally aligned. For example and with reference to FIG. 6, there is shown the relative disposition of the through-openings 68 of the shutters 60 and 62 when positioned forty-five degrees out of phase with one another. It can be seen in this FIG. 6 example that the superposed relationship of the through-openings 68 collectively define two openings wherein each opening has an area which is equal to that of a forty-five degree sector. Accordingly, as the shutters 60 and 62 are rotated in unison, at constant velocity and forty-five degrees out of phase with one another, the substrate 32 is exposed to the vapors from the source 46 throughout one-fourth of the period of each revolution of the shutters 60 and 62 about the axis 64.

Figure 7:
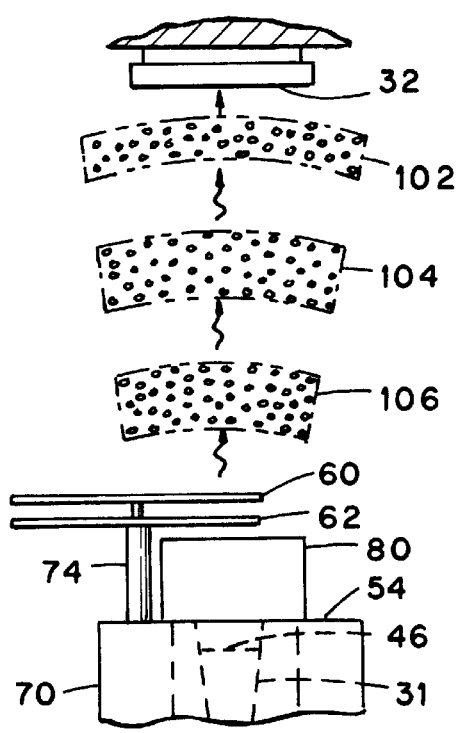
FIGS. 7 and 8 are fragmentary side views illustrating schematically the relative sizes of the vapor pulses emitted with the superposed shutters of the FIG. 5 and FIG. 6 arrangements.
Figure 8:
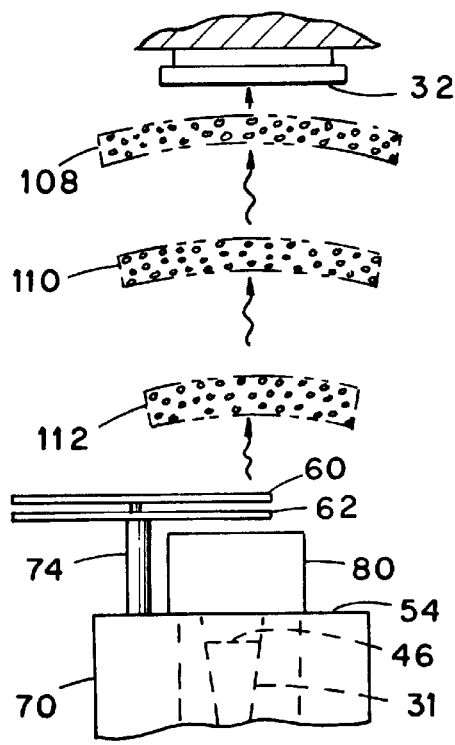

The capacity to control the emission of vapor from each cell 31 with the system 20 can be readily appreciated with reference to FIGS. 7 and 8 which illustrate the relative size and spacing of pulses of flux vapor emitted from a cell 31 when the shutters 60, 62 are arranged, on one hand, in phase with one another and are arranged, on the other hand, forty-five degrees out of phase with one another. In particular, the shutters 60, 62 are arranged in phase with one another in the FIG. 7 view and sequential vapor pulses are designated 102, 104 and 106, respectively. It can be seen in this example that since the aligned through-openings 68 of the "in phase" shutters 60 and 62 permit exposure of the substrate 32 to the material source 46 throughout one-half of a single revolution of the shutters 60, 62 (at constant speed as discussed above), the pulses 102, 104 and 106 each have thickness (as measured between the top and bottom of each pulse) which generally corresponds to that of the duration between the adjacent pulses.

By comparison, the shutters 60, 62 are arranged forty-five degrees out of phase with one another in the FIG. 8 view and sequential vapor pulses are designated 108, 110 and 112, respectively. It can be seen in this example that since the superposed through-openings 68 of the "forty-five degrees out of phase" shutters 60 and 62 permit exposure of the substrate 32 to the material source 46 throughout only one-fourth of a single revolution of the shutters 60, 62 (at constant speed as discussed above), the pulses 108, 110 and 112 each have duration which is about one-half of that of a corresponding pulse 102, 104 or 106 of the FIG. 7 example and about one-third of the duration of the spacings between the adjacent pulses.

Therefore, by preselecting the relative position of the shutters 60, 62 about the axis 64 to provide a desired phase relationship of the through-openings of the shutters 60, 62 and then rotating the shutters 62 in unison at a desired (e.g. constant) speed across the exit end 54 of the cell 31 provides a means for controlling the duration of the vapor pulses emitted from the cell 31 and/or for controlling the spacing (i.e. period of time) between successive pulses of vapor emitted from the cell 31. Furthermore, since the flux of vapor emitted from the cell corresponds with the rate at which atoms are emitted from the cell 31 per unit of time, then the flux of source vapor arriving at the surface of the substrate 32 can be controlled by appropriately selecting the phase relationship of the shutters 60 and 62 and then rotating the shutters 60 and 62 in unison about the axis 64 at a desired rate of speed. It follows that adjustments to the flux of vapor from the source arriving at the sample surface 32 averaged over one period can be adjusted by making appropriate adjustments to the phase relationship between the shutters 60, 62 and/or the rotational speed of the shutters 60, 62.

An advantage provided by the control system 20 relates to the reduction of dependency upon temperature control alone to control the flux of vapor arriving at the substrate. In other words, the control system 20 is capable of accurately controlling the source flux with less regard to the temperature of the source material as was the case with flux-control schemes of the prior art which effected the flux solely by altering the temperature of the source material. It may still be desirable in some instances in which the system 20 is used that adjustments to the temperature of the source be made to alter the flux, but the disadvantages and inherent physical limitations (which would otherwise render a deposition process relatively time consuming) attending an adjustment of flux by temperature alone are obviated by the control system.

Another advantage of the control system 20 relates to the improved uniformity of thickness of the resulting deposition of material upon the substrate 32. Such improved uniformity in thickness is due, at least in part, to the passage of the edges of the through-openings across the exit end 54 of the cell 31 in the same (rotational) direction. In shutter arrangements of the prior art wherein a shutter was pivoted back and forth across the mouth of a crucible in one direction and then the opposite direction, the (upwardly) projected area of the source material contained within the crucible was never evenly exposed to the substrate. In other words, the region of the source which was the first to be uncovered by a shutter moved in one direction across the crucible mouth was also the last to be re-covered by the shutter as it is moved in the opposite direction across the crucible mouth, and the resulting non-uniformity of exposure of the projected area of the source to the substrate leads to non-uniformity of the flux profile and thus a non-uniformity in the deposition of the vaporized materials on the substrate. Moreover, the resulting non-uniformity in deposition is particularly evident when the period of time that the shutter is open is relatively short (e.g. less than 1.6 seconds). By passing the shutter 60, 62, or more specifically, the radially-extending edges of the through-openings 68 across the exit end 54 of the cell 31 in the same rotational direction, the (upwardly) projected area of the source is uniformly exposed to the substrate throughout each pass of the through-openings 68 across the exit end 54 and contributes to a relatively uniform distribution of the vaporized material — without regard to the speed of movement of the shutters across the mouth of the source. Consequently, the shutters can be rotated about the axis 64 very rapidly to permit vapor pulses of very short duration (e.g. less than 0.2 seconds) to be emitted from the cell 31 while providing a uniform flux profile throughout that short duration.

Still another advantage of the system 20 can be appreciated when considering a deposition application wherein it is desired to deposit a compound, or alloy, upon a substrate in a layered configuration. For example, there is provided for such a purpose the plurality of cell assemblies 26, 28 and 30 in the FIG. 1 facility 22 wherein each cell assembly 26, 28 and 30 is adapted to hold a different element, or constituent, of the compound desired to be built up upon the substrate 32. Because the rotating shutters associated with each cell assembly 26, 28 and 30 generate vapor pulses which are spaced in time, the shutters of the various cell assemblies 26, 28 or 30 can be appropriately synchronized with one another to emit vapor pulses from one cell assembly between the vapor pulses emitted of another cell assembly.

Figure 9:
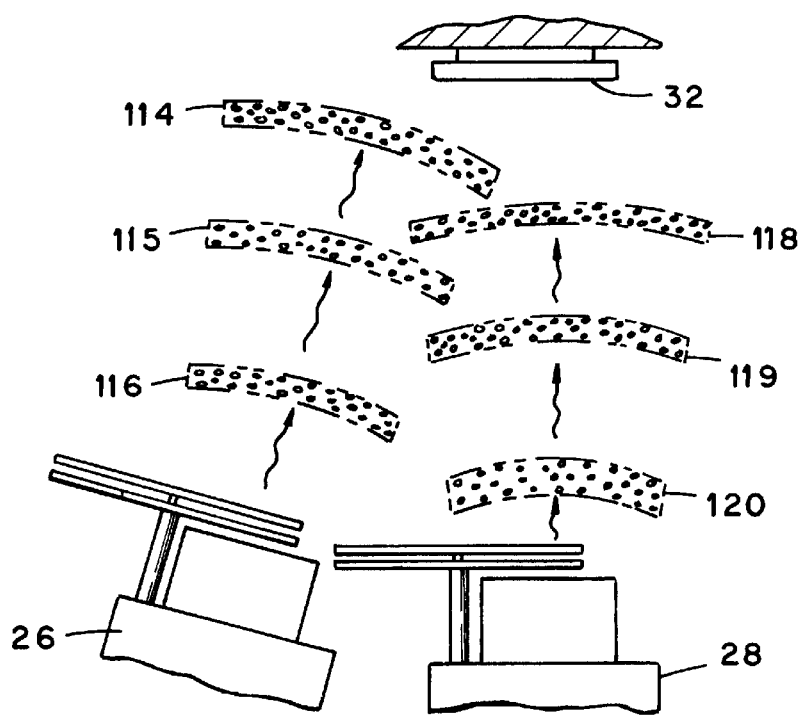
FIG. 9 is a view similar to that of FIGS. 7 and 8 illustrating schematically the relationship of vapor pulses emitted from a pair of effusion cell assemblies of the FIG. 1 facility.

For example, there is shown in FIG. 9 a schematic representation of two cell assemblies 26 and 28 used to emit a series of vapor pulses toward a substrate 32 wherein the vapor pulses emitted by each cell assembly 26 or 28 is comprised of a different element. For purposes here, the sequence of vapor pulses emitted by the cell assembly 26 are designated as 114, 115 and 116, and the sequence of vapor pulses emitted by the cell assembly 28 are designated 118, 119 and 120. By appropriately timing the exposure of the substrate 32 to the source materials contained in the corresponding cell assemblies 26, 28 (by appropriately coordinating the rotation of the shutters of the cell assemblies 26, 28 with respect to one another and the relative position of the shutters of one cell assembly with respect to the shutters of the other cell assembly), the vapor pulses of the different elements can be emitted toward the substrate 32 in an alternating fashion so that the resulting layup of the deposited compound is comprised of alternating layers of the different elements. The capacity provided by the system 20 to build up a compound upon a substrate 32 in such a manner, coupled with the capacity to control the flux and duration of the intermittent vapor pulses, enables a compound to be deposited upon a substrate in a layup arrangement relatively rapidly and is believed to render the system 20 well-suited for mass production techniques.

Further still, suppose it was desired to vapor-deposit a multilayer alloy $ABC_2$ upon a substrate wherein constituent layers comprised of A and B, respectively, are full monolayers and alternate with a constituent layer of C situated between the layers of A and B to provide a layup arrangement of A/C/B/C/A/C/B/C . . . Practical examples can involve the growth of InGaAs/AlGaAs multilayers, and when deposited with the coaxial shutter configurations depicted in FIGS. 3–8, can be grown at high rates and with uncompromised uniformity. In this example, suppose source materials A, B and C (contained in separate cell assemblies) having coaxial shutter arrangements (like that of shutters 60 and 62 of FIGS. 3–8) wherein the temperature for source A is set for a flux of FA (ML/second), source B is set for a flux of FB, and source C is set for a flux of FC. Therefore, in this case, the time necessary to deposit one monolayer of each corresponding material takes 1/FA, 1/FB or 1/FC seconds. To be determined are the relative phases for the shutters as well as the rotational speed.

Figure 11:
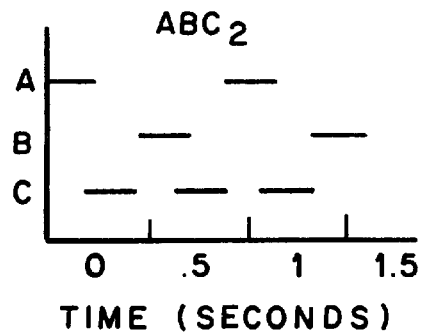
FIG. 11 is a graph depicting the sequence of material deposition and the deposition times involved in depositing a multilayer alloy $ABC_2$ upon a substrate with three effusion cell assemblies employing the coaxial shutter arrangement depicted in FIGS. 3–8.

To achieve the desired layup structure A/C/B/C, the sources must be deposited in the appropriate sequence, have approximately the same fluxes and in accordance with the timing sequences depicted in the graph of FIG. 11. This example assumes that the flux of source A (or $F_A$) equals 48 ML/second (i.e. monolayer/second), $F_B$=51 ML/second and $F_C$=4.4 ML/second so that the shutter arrangement for source A is open for 0.021 seconds, so that the shutter arrangement for source B is open for 0.02 seconds, and so that the shutter arrangement for source C is open for 0.023 seconds. The rotational speed of the shutter set for source C must be twice that for sources A and B. In order to ensure that the layers do not overlap during deposition, the rotational speed ω (radians/second) of the shutters for each of the sources A and B is given by:

$$\omega \geq \pi[\min(F_A, F_B)F_C]/2[\min(F_A, F_B)+F_C] \qquad \text{Eq. 1}$$

wherein $\min(F_A, F_B)$ is the smaller of the flux of source A and the flux of source B. In this example, ω=344 rpm with the shutter speed for source C set at 688 rpm. Once the rotational speed is determined, the phase Φ is fixed for the sources A, B and C by the following equation:

$$\Phi_{A,B,C} = \frac{1}{2}\left(\pi - \frac{\omega_{A,BC}}{F_{A,BC}}\right) \qquad \text{Eq. 2}$$

It follows that the growth rate for the desired layup is 10 ML/second. While such a structure could be grown using conventional shutters (i.e. those that pivot back and forth about an axis) but at a growth rate of no better than four-hundred times slower than with the coaxial shutter configuration of FIGS. 3–8 due, in large part, to the non-uniformity of the flux profile at shorter shutter times.

As mentioned earlier and with reference to FIG. 10, a computer controller 100 is associated with the control system 20 for coordinating the operation of the various components of the system 20 during a deposition operation performed with the facility 22. To this end, the servomotors 90, 92 associated with each cell assembly 26, 28 and 30 are connected to the controller 100 for control of the speed and actuation of the motors 90, 92 during a deposition operation. Similarly, the controller 100 is appropriately wired to the electric heating elements 36 of each cell 31 to control the actuation of the elements 36. Preferably, temperature sensors (not shown) are coupled to the cells 31 and wired to the controller 100 so that the temperature of the source 46 contained within the crucibles 36 can be accurately monitored by the controller 100 and adjustments made, if necessary, by appropriate actuation of the heating elements 36 to accurately maintain the temperature of the source 46 at a desired temperature.

The encoder means 94 associated with each cell assembly 26, 28 and 30 is also connected to the controller 100 so the signals generated by the encoder sensors 96 can be used to determine and monitor the position of the shutters 60, 62 relative to one another (and hence the phase relationship of the shutter through-openings) during rotation of the shutters 60, 62 across the exit end of a corresponding cell 31. If, for example, it is desired that adjustments be made in the phase relationship of the shutter through-openings, the servomotors 90 and 92 are appropriately energized to position the inner shaft 74 (FIGS. 2 and 3) at an alternative rotational position relative to the outer shaft 72 and thereby shift the rotational (i.e. phase) relationship of the shutters 60, 62.

Moreover, the deposition rate monitor 84 (FIG. 3) associated with each cell assembly 26, 28 and 30 is connected to the controller 100 thereby enabling the controller 100 to monitor the rate of the atoms being emitted (or vaporized) from the source 46 upstream of the shutters 60, 62. By mounting the deposition rate monitor 84 between the mouth 35 of the crucible 34 and the underside of the shutters 60, 62 for collecting information thereat, information relating to the emission of the atoms from the source can be continually monitored — whether or not a vapor pulse is permitted to pass through the shutters 60, 62, and this feature of the system 20 is advantageous in this respect. Another deposition rate monitor 130 (e.g. containing a quartz crystal) can be mounted within the facility container 24 and adjacent the substrate 32 (and downstream of the shutters 60, 62) and wired to the controller 100 for providing additional means for monitoring and/or controlling the deposition rate conditions attending each cell assembly 26, 28 or 30. In practice, the deposition rate monitors 84 and 130 are used to detect the variances in the output of vapor from the cell assemblies 26, 28 and 30 so that adjustments can be made, for example, to the temperature of the source 46, to the phase relationship of the shutters 60, 62 or to the rotational speed of the shutters 60, 62 about the axis 64 to compensate for such variances.

It follows that with the input (relating to the deposition process) received by the computer controller 100 during the operation of the facility 20 and with the capacity of the controller 100 to alter and control the operations of the various components of the system 20 as aforedescribed in response to the input received, a deposition process involving the build-up of source materials contained within one or more of the cell assemblies 26, 28 and 30 can be accurately and precisely controlled. In addition, adjustments to the deposition operation (by way of, for example, the phase relationship of the shutters 60, 62) can be made to effect an immediate change in the flux or other emission parameters. Thus, time-related problems which commonly attend the changing of deposition rate conditions solely by varying the temperature at the source can be circumvented. It follows that the system 20, along with the automatic controls effected by the controller 100, promote the deposition of a compound upon a substrate in much less time than would be necessary with conventional shuttering/deposition techniques.

With reference to FIG. 12, there is shown an alternative embodiment of a control system 150 within which features of the invention are embodied. More specifically, the system 150 is incorporated within an effusion cell assembly 152 having an effusion cell which is identical in construction to the effusion cell 31 of FIGS. 2 and 3. Accordingly, components of the cell assembly 152 of FIG. 12 which correspond to the cell assembly 26 of FIGS. 2 and 3 bear the same reference numerals. As is apparent herein, the control system 150 is physically larger than the control system embodiment 20 FIGS. 1–8 (which employs a coaxial shutter arrangement), but may be used in place of the control system 20 of FIGS. 1–8 in instances where facility space limitations permit.

The control system embodiment 150 of FIG. 12 includes two symmetrically-balanced shutters 154, 156 (similar in shape and form to the shutters 60, 62 of FIGS. 2–8) which are arranged in superposed relationship and means, generally indicated 158, for mounting the shutters 154, 156 for rotation about spaced and parallel axes 160, 162, respectively. In this depicted system 150 wherein the rotation axes 160 and 162 are displaced from one another, the mounting means 158 includes a jacket 164 secured about the body of the cell 31 and a pair of spaced and parallel shafts 166 and 168 rotatably mounted within the jacket 164 on opposite sides thereof. Gear assemblies 169 are coupled between each shutter 154 or 156 and its corresponding shaft 166 or 168 so that the shutter rotation axes 160 and 162 are positioned inboard of the rotation axes of the shafts 166, 168. Mounted beneath the securement flange portion 42 of the cell 31 are servomotors 170, 172 and associated vacuum feedthroughs 171, 173 appropriately coupled to the shafts 166, 168 rotating the shutters 154, 156 in opposite rotational directions. It follows that actuation of the servomotors 170, 172 effects the rotation of the shutters 154, 156 by way of the feedthroughs 171, 173, shafts 166, 168 and gear assemblies 169.

As best shown in FIGS. 13 and 14, each of the superposed displaced shutters 154, 156 are arranged adjacent the mouth of the crucible containing the source 46 so that when rotated, the closure portions 66 thereof pass across so as to intermittently cover and uncover the source 46. Moreover and as is the case with the shutters 60, 62 of the embodiment 20 of FIGS. 1–8, the angular relationship of each shutter 154 or 156 relative to one another and about its corresponding axis 160 or 162 can be preselected so that when rotated, the parameters attending the emission of the vapors from the source 46 can be controlled and altered, as necessary, to control and alter, as necessary, a deposition process involving the source vapors.

During use of the control system 150, the shutters 154, 156 are rotated at the same rotational speed, but in opposite rotational directions, about the axes 160, 162 while the independence of the shutters 154 and 156 permits the adjustment of the position of one shutter 154 or 156 relative to the other shutter 156 or 154 about its corresponding axis 160 or 162 to thereby alter the phase relationship of the shutters 154 and 156. For example and with reference again to FIG. 13, there is shown the relative disposition of the through-openings 68 of the shutters 154 and 156 when positioned in phase with one another. In this FIG. 13 example, the shutter through-openings 68 are aligned so as to provide the largest open area through the superposed shutters 154 and 156. Therefore, when rotating the depicted shutters 154, 156 (whose open areas are equal in size to the sum of two ninety-degree sectors of the shutters) at constant velocity and in phase with one another, vaporized material emitted from the source 46 is permitted to pass through the superposed shutters 154, 156 throughout one-half of the period of each revolution of the shutters 154, 156.

By comparison, and with reference to FIG. 14, there is shown the relative disposition of the through-openings 68 of the shutters 154 and 156 when positioned forty-five degrees out of phase with one another. It can be seen in this FIG. 14 example that the superposed relationship of the through-openings 68 (as they pass across the source 46) collectively define an opening over the source 46 which has an area which is equal to that of about one-half of a ninety degree sector. Accordingly, as the shutters 154 and 156 are rotated over the source 46 at constant velocity and forty-five degrees out of phase with one another, the vaporized material is permitted to pass through the shutters 154, 156 throughout about one-fourth of the period of each revolution of the shutters 154 and 156 about the axes 160, 162.

It follows that by controlling the phase relationship of the shutters 154, 156 as the shutters 154, 156 are rotated about the axes 160, 162, the parameters attending the emission of vapors from the source 46 can be controlled with the FIG. 12 embodiment 150 in much the same manner in which the emission parameters can be controlled with the system embodiment 20 of FIGS. 1–8. In other words, by preselecting the relative position of the shutters 154, 156 about the axes 160, 162 to provide a desired phase relationship of the through-openings of the shutters 154, 156 and then rotating the shutters 154, 156 across the source 46 at a desired (e.g. constant) speed provides a means for controlling the duration of the vapor pulses emitted from the source 46 and/or for controlling the spacing (i.e. period of time) between successive pulses of vapor emitted from the source 46, as well as the flux of source vapor arriving at the surface of a substrate. Adjustments to the emission parameters can be made by making appropriate adjustments to the phase relationship between the shutters 154, 156 and/or the rotational speed of the shutters 154, 156.

Although the aforedescribed embodiments 20 and 150 have been shown and described as including two shutters and which act in concert to alter or control the source flux and the related parameters of the vapor being emitted from the source, comparable control of the source flux and related parameters can be had with a single shutter. For example, in either the aforedescribed coaxial shutter configuration (involving shutters 60, 62) or the aforedescribed displaced shutter arrangement (involving shutters 154, 156), a single rotating shutter can be used to vary the flux if the angular velocity is varied while the other shutter is maintained in a stationary position over the source so that its through-opening 68 is in full phase with the source. In particular, with the designs of any of the aforedescribed shutters 60, 62, 154 or 156 wherein the flux is ON for ninety degrees and OFF for ninety degrees when the shutter is rotated at constant velocity (while the other shutter remains stationary in an open position), then the average flux downstream (or beyond) the rotating shutter is half the flux from the source mouth. Moreover, the flux profile is unaffected by the rotating shutter when rotated at constant velocity.

However, the flux can be increased by slowing down the rotating shutter during the periods that the shutter uncovers the crucible mouth and speeding up the shutter during the periods that the shutter covers the crucible mouth. Taking into account that the rotating shutter will, in this case, experience periods during which its angular velocity is accelerated and decelerated, it has been found that for a source having a crucible diameter of 1.25 inches, a shutter radius (as measured from its rotation axis) of 1.025 inches, and a maximum angular velocity of 500 rpm, the flux arriving at the substrate can be varied from between forty-five to fifty-five percent of the flux emitted from source 46 while maintaining the velocity of the shutter within the range of between 0 and 1,000 rpm.

It follows from the foregoing that an apparatus, system and method have been described for controlling parameters, such as the flux, attending the emission of a vaporized material from a source. Each of the aforedescribed embodiments utilize a moving shutter which rotates about an axis adjacent the mouth of a source-containing crucible for covering and uncovering the source in an intermittent fashion. By controlling the rotational speed of a single shutter throughout each revolution about its axis or utilizing superposed shutters whose phase relationship can be controllably adjusted in conjunction with the control of temperature of the source, the emission parameters, such as the flux, responsible for the build up of vaporized material upon a substrate, can be accurately and precisely controlled to a degree heretofore unattainable. Moreover, the rapidity with which the emission parameters can be altered with the aforedescribed systems renders many HV vapor-deposition operations (such as MBE) practical for mass production applications which have heretofore not been considered as practical.

It will be understood that numerous modifications and substitutions can be had to the aforedescribed embodiments without departing from the spirit of the invention. For example, although the aforedescribed methods directed to the deposition of an alloy or compound in a layup arrangement upon a substrate have been described above as involving a plurality of effusion cell assemblies whose shutters are never open during the same periods of time, methods in accordance with the broader aspects of the involve are not so limited. For example, for the purpose of depositing two materials E and D in a single layer, the movement of the shutters associated with the two effusion cells containing source materials E and D, respectively, may be coordinated so that the shutters are open throughout the same periods of time or, if desired, so that the shutter of one cell is opened during a fraction of a period that the shutter of the other cell is open. Accordingly, the aforedescribed embodiments are intended for the purpose of illustration and not as limitation.

We claim:

1. An apparatus for controlling at least one parameter attending the emission of a vaporized material from a source in a HV environment wherein there is associated with the source an exit opening through which vaporized material must exit the source, the apparatus comprising:

a shutter including a body having a closure portion;

means for mounting the body of the shutter adjacent the exit opening associated with the source for rotation about an axis so that by rotating the shutter about the rotation axis, the closure portion repeatedly covers and uncovers the exit opening in an intermittent fashion; means for rotating the shutter in one rotational direction about the rotation axis to prevent the travel of a vaporized material very far through the exit opening of the source during the periods of shutter rotation during which the exit opening is covered by the closure portion and to permit the travel of a vaporized material far through the exit opening of the source during the periods of shutter rotation during which the exit opening is uncovered by the closure portion; and means for monitoring the emission of the vaporized material from the source and means responsive to the monitoring means for altering the speed of rotation of the shutter about its rotation axis wherein the monitoring means includes means for monitoring the evaporation rate of the vaporized material at a location located generally between the source and the shutter.

2. The apparatus as defined in claim 1 wherein the body of the shutter is substantially planar in form and is mountable adjacent the exit opening so that the body of the shutter is rotated in a plane across the exit opening.

3. The apparatus as defined in claim 2 wherein the closure portion of the shutter body includes edges which extend generally radially of the rotation axis.

4. The apparatus as defined in claim 2 wherein the closure portion of the shutter body is a first closure portion and the shutter body includes a second closure portion which is disposed on the opposite side of the rotation axis from the first closure portion.

5. The apparatus as defined in claim 1 further including means associated with the rotating means for controlling the speed of rotation of the shutter about its rotation axis to thereby control the intervals during which the exit opening is uncovered by the closure portion throughout each revolution of the shutter about its rotation axis.

6. The apparatus as defined in claim 1 wherein the shutter is a first shutter and the system further includes:

a second shutter including a body having a closure portion;

means for mounting the body of the second shutter adjacent the exit opening associated with the source for rotation about an axis so that by rotating the second shutter about the rotation axis, the closure portion of the second shutter repeatedly covers and uncovers the exit opening in an intermittent fashion; and means for rotating the second shutter about its rotation axis to prevent the travel of a vaporized material very far through the exit opening of the source during the periods of shutter rotation during which the exit opening is covered by the closure portion of the second shutter; and the first and second shutters are arranged in superposed relationship adjacent the exit opening so that as each of the first and second shutters are rotated about its rotation axis, the travel of a vaporized material far through the exit opening of the source is permitted only during the periods of shutter rotation during which the exit opening is uncovered by the closure portions of the first and second shutters.

7. The apparatus as defined in claim 6 further including means for altering the positional relationship of the closure portion of the first shutter relative to the closure portion of the second shutter to thereby alter an interval of shutter revolution during which the exit opening is uncovered by the closure portions of the first and second shutters.

8. A system for controlling at least one parameter attending the emission of a vaporized material from a source in a HV environment, the system comprising:

means for vaporizing a material from a source;

means associated with the source providing an exit opening through which vaporized material must exit the source;

a shutter including a body having a closure portion;

means for mounting the body of the shutter adjacent the exit opening associated with the source for rotation about an axis so that by rotating the shutter about the rotation axis, the closure portion repeatedly covers and uncovers the exit opening in an intermittent fashion; and means for rotating the shutter about the rotation axis to prevent the travel of a vaporized material very far through the exit opening of the source during the periods of shutter rotation during which the exit opening is covered by the closure portion and to permit the travel of a vaporized material far through the exit opening of the source during the periods of shutter rotation during which the exit opening is uncovered by the closure portion; and means for monitoring the emission of the vaporized material from the source and means responsive to the monitoring means for altering the emission of the vaporized material through the exit end by adjusting the speed of rotation of the shutters or the positional relationship of the closure portion of the first shutter relative to the closure portion of the second shutter and wherein the monitoring means includes means for monitoring the evaporation rate of the vaporized material at a location generally between the source and the shutter.

9. The system as defined in claim 8 wherein the body of the shutter is substantially planar in form and is mountable adjacent the exit opening so that the body of the shutter is rotated in a plane across the exit opening.

10. The system as defined in claim 9 wherein the shutter is a first shutter and the system further includes;

a second shutter including a body having a closure portion;

means for mounting the body of the second shutter adjacent the exit opening associated with the source for rotation about an axis so that by rotating the second shutter about its rotation axis, the closure portion of the second shutter repeatedly covers and uncovers the exit opening in an intermittent fashion; and means for rotating the second shutter about its rotation axis to prevent the travel of a vaporized material very far through the exit opening of the source during the periods of shutter rotation during which the exit opening is covered by the closure portion of the second shutter; and the first and second shutters are arranged in superposed relationship adjacent the exit opening so that as each of the first and second shutters are rotated about its rotation axis, the travel of a vaporized material is permitted far through the exit opening of the source only during the periods of shutter rotation during which the exit opening is uncovered by the closure portions of the first and second shutters.

11. The system as defined in claim 10 further including means for altering the positional relationship of the closure portion of the first shutter about its rotation axis relative to the closure portion of the second shutter about its rotation axis to thereby alter an interval of shutter revolution during which the exit opening is uncovered by the closure portions of the first and second shutters during rotation of the shutters.

12. The system as defined in claim 10 wherein the rotation axes of the shutters are coincident.

13. The system as defined in claim 10 wherein the rotation axes of the shutters are in spaced and parallel relation to one another.

14. A method for controlling at least one parameter attending the emission of a vaporized material from a source in a HV environment wherein there is associated with the source an exit opening through which vaporized material must exit the source, the method comprising the steps of:

providing a shutter including a body having a closure portion;

mounting the body of the shutter adjacent the exit opening associated with the source for rotation about an axis so that by rotating the shutter about the rotation axis, the closure portion repeatedly covers and uncovers the exit opening in an intermittent fashion; and rotating the shutter in one rotational direction about the rotation axis to prevent the travel of a vaporized material very far through the exit opening of the source during the periods of shutter rotation during which the exit opening is covered by the closure portion and to permit the travel of a vaporized material far through the exit opening of the source during the periods of shutter rotation during which the exit opening is uncovered by the closure portion; and monitoring the evaporation rate of the vaporized material at a location generally between the source and the shutter.

15. The method as defined in claim 14 further including a step of controlling the speed of rotation of the shutter about its rotation axis to thereby control the intervals during which the exit opening is uncovered by the closure portion throughout each revolution of the shutter about its rotation axis.

16. The method as defined in claim 14 including the steps of:

controlling the temperature of the source; and altering parameters attending the travel of the vaporized material through the exit opening of the source in response to the monitored evaporation rate, as necessary, by either altering the periods of shutter rotation during which the vaporized material is permitted to pass the shutter or altering the temperature of the source.

17. A method for controlling at least one parameter attending the emission of a vaporized material from the source in a HV environment wherein there is spaced from the source an exit opening through which vaporized material moves from the source, the method comprising the steps of:

monitoring the evaporation rate of the vaporized material moving from the source at a location disposed adjacent the exit opening of the source; and utilizing the monitored evaporation rate to alter at least one parameter attending the emission of the vaporized material from the source.

* * * * *